United States Patent
Uya

(10) Patent No.: US 7,723,663 B2
(45) Date of Patent: *May 25, 2010

(54) CMOS IMAGE PICK-UP WITH INTEGRATED OPTICAL AND ELECTRONIC ELEMENTS AND MICRO BUMP CONNECTORS

(75) Inventor: Shinji Uya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/103,809

(22) Filed: Apr. 16, 2008

(65) Prior Publication Data

US 2008/0265138 A1   Oct. 30, 2008

(30) Foreign Application Priority Data

Apr. 27, 2007   (JP)   ............................ P2007-118828

(51) Int. Cl.
*H01L 27/00*  (2006.01)
(52) U.S. Cl. ................................. 250/208.1; 250/214 R
(58) Field of Classification Search ............. 250/208.1, 250/214 R, 239; 257/290–294, 440–443; 438/73–85; 348/294–324

See application file for complete search history.

(56) References Cited

U.S. PATENT DOCUMENTS 7,015,522 B2 * 3/2006 Miyagawa et al. .......... 257/292
7,294,873 B2 * 11/2007 Suzuki et al. ............... 257/225

FOREIGN PATENT DOCUMENTS

JP         1-102321 A     4/1989
JP      2007-13089 A      1/2007

* cited by examiner

*Primary Examiner*—Que T Le
(74) *Attorney, Agent, or Firm*—Birch, Stewart, Kolasch & Birch, LLP

(57) ABSTRACT

An image pick-up element comprises: an optical element substrate part in which the image pick-up element generates a signal charge by photo-electrically converting an incident light applied from one surface side of the optical element substrate part to read the signal charge from the other surface side of the optical element substrate part and picks up an image; and a CMOS circuit substrate part connected to the other surface side of the optical element substrate part so as to transfer the signal charge generated in the photoelectric conversion layer, wherein the optical element substrate part comprises a photoelectric conversion layer to generate the signal charge by photo-electrically converting the incident light.

7 Claims, 4 Drawing Sheets

CMOS IMAGE PICK-UP WITH INTEGRATED OPTICAL AND ELECTRONIC ELEMENTS AND MICRO BUMP CONNECTORS

BACKGROUND OF THE INVENTION

1. Field of the Invention

The present invention relates to a CMOS type image pick-up element that realizes the micro formation, the high function and the high sensitivity of a picked up image of a visible light.

2. Description of the Related Art

FIG. 4 is a diagram showing one example of a structure of the related-art CMOS type image sensor. The CMOS type image sensor is considered to be promising, like a CCD type image sensor, from the viewpoint that an integrated circuit similar to a one-chip camera can be realized by integrating a microlens for converging incident lights, a spectral filter, an optical element part provided with a photodiode for carrying out a photoelectric conversion and a signal storage, a signal scanning part for scanning stored signals, a gain control amplifier for amplifying the signal as an output and signal processing circuit parts such as a sample hold circuit for removing noise, an analog/digital converting circuit or the like. The related-art image sensors are disclosed in JP-A-2007-13089 and JP-A-1-102321.

However, the CMOS type image sensor has a problem that the scale of the circuit parts except the optical element part is enlarged, and includes problems in view of below-described points.

(1) Since a multi-layer wiring is introduced due to the high function of the peripheral circuit and the matching characteristics of a color filter process or a microlens process are not good, optical characteristics are inferior to those of the CCD image sensor.

(2) When the scale of the peripheral circuits is enlarged, a cost is increased owing to the loss of the peripheral circuit that is inferior due to the defect of an image.

(3) When a pixel is micronized, an optical path for guiding the incident light to the surface of a silicon substrate needs to be maintained to a size having a prescribed ratio to a wavelength so that an occupation rate of the photodiode is disadvantageously increased in the pixel to achieve a micro formation and a high function.

SUMMARY OF THE INVENTION

The present invention is devised by considering the above-described circumstances and it is an object to provide an image pick-up element and a photoelectric conversion element array that has a structure advantageous for improving a design and production efficiency of a circuit part and obtaining a micro formation, a high function and a high sensitivity and can reduce a development cost.

The above-described object is achieved by below-described structures.

(1) An image pick-up element comprising: an optical element substrate part in which the image pick-up element generates a signal charge by photo-electrically converting an incident light applied from one surface side of the optical element substrate part to read the signal charge from the other surface side of the optical element substrate part and picks up an image; and a CMOS circuit substrate part connected to the other surface side of the optical element substrate part so as to transfer the signal charge generated in the photoelectric conversion layer, wherein the optical element substrate part comprises a photoelectric conversion layer to generate the signal charge by photo-electrically converting the incident light.

(2) An image pick-up element according to the above-described (1), further comprising: an element side connecting terminal connected to the photoelectric conversion layer for each pixel of the optical element substrate part; and a circuit side connecting terminal formed on a surface of a side in the CMOS circuit substrate part to be connected to the optical element substrate part, wherein the element side connecting terminal is connected to the circuit side connecting terminal to each other on the other surface of the optical element substrate part.

(3) An image pick-up element according to the above-described (1) or (2), wherein the photoelectric conversion layer comprises a depletion layer having a thickness of 5 μm or more to 20 μm or less.

(4) An image pick-up element according to any one of the above-described (1) to (3), wherein the connecting terminal comprises a micro bump.

(5) An image pick-up element according to any one of the above-described (1) to (4), further comprising a color filer layer formed on the one surface of the optical element substrate part.

(6) An image pick-up element according to any one of the above-described (5), further comprising a microlens layer formed on the color filter layer.

(7) An image pick-up element according to any one of the above-described (1) to (5), further comprising a transparent support substrate that supports the optical element substrate part when the optical element substrate part is connected to the CMOS circuit substrate part, the transparent support substrate being in the one surface side of the optical element substrate part.

(8) An image pick-up element according to the above-described (6), further comprising: a transparent support substrate that supports the optical element substrate part when the optical element substrate part is connected to the CMOS circuit substrate part, the transparent support substrate being in the one surface side of the optical element substrate part; and an adhesive layer whose refractive index is lower than that of the microlens layer to connect the support substrate to the optical element substrate part, the adhesive layer being between the microlens layer and the transparent support substrate.

(9) A photoelectric conversion element array comprising an optical element substrate part in which the photoelectric conversion element array generates a signal charge by photo-electrically converting an incident light applied from one surface side of an optical element substrate part to read the signal charge from the other surface side of the optical element substrate part and picks up an image, wherein the optical element substrate part comprises: a photoelectric conversion layer to generate the signal charge by photo-electrically converting the incident light, the photoelectric conversion layer being provided over a plurality of pixel regions arranged in an array manner; and a connecting terminal for each of said plurality of pixel regions, the connecting terminal being provided in the other surface side of the optical element substrate to transfer the signal charge generated in the photoelectric conversion layer.

The image pick-up element of the present invention is formed by connecting the optical element substrate part having a function for photo-electrically converting the incident light to the CMOS circuit substrate part. The substrate parts are respectively previously produced under a separated state. Since the incident light applied from the one surface side of the optical element substrate part is photo-electrically converted to generate the signal charge and the signal charge is read from the other side of the optical element substrate part located in the circuit substrate part side, a circuit part does not need to be formed in the optical element substrate part so that an opening of a light receiving part of the optical element substrate part side can be designed to be large. Therefore, the micronization and the high function of the pixel can be advantageously realized.

As compared with a process that a circuit part and an optical element part are sequentially manufactured on a semiconductor substrate as in the related-art CMOS type image pick-up element, the yield of the image pick-up element itself can be avoided from decreasing by receiving the influence of the decrease of the yield of either the circuit part or the optical element part. The already manufactured optical element substrate part is connected to the CMOS circuit substrate part so that the production efficiency of the image pick-up element can be improved.

Further, since the optical element part does not need to be formed in the CMOS circuit substrate part, a time necessary for a production process can be shortened, a degree of freedom of design of a circuit in the CMOS circuit substrate part is high and a design efficiency can be improved.

DETAILED DESCRIPTION OF THE INVENTION

Now, an embodiment of the present invention will be described below in detail by referring the drawings.

Figure 1:
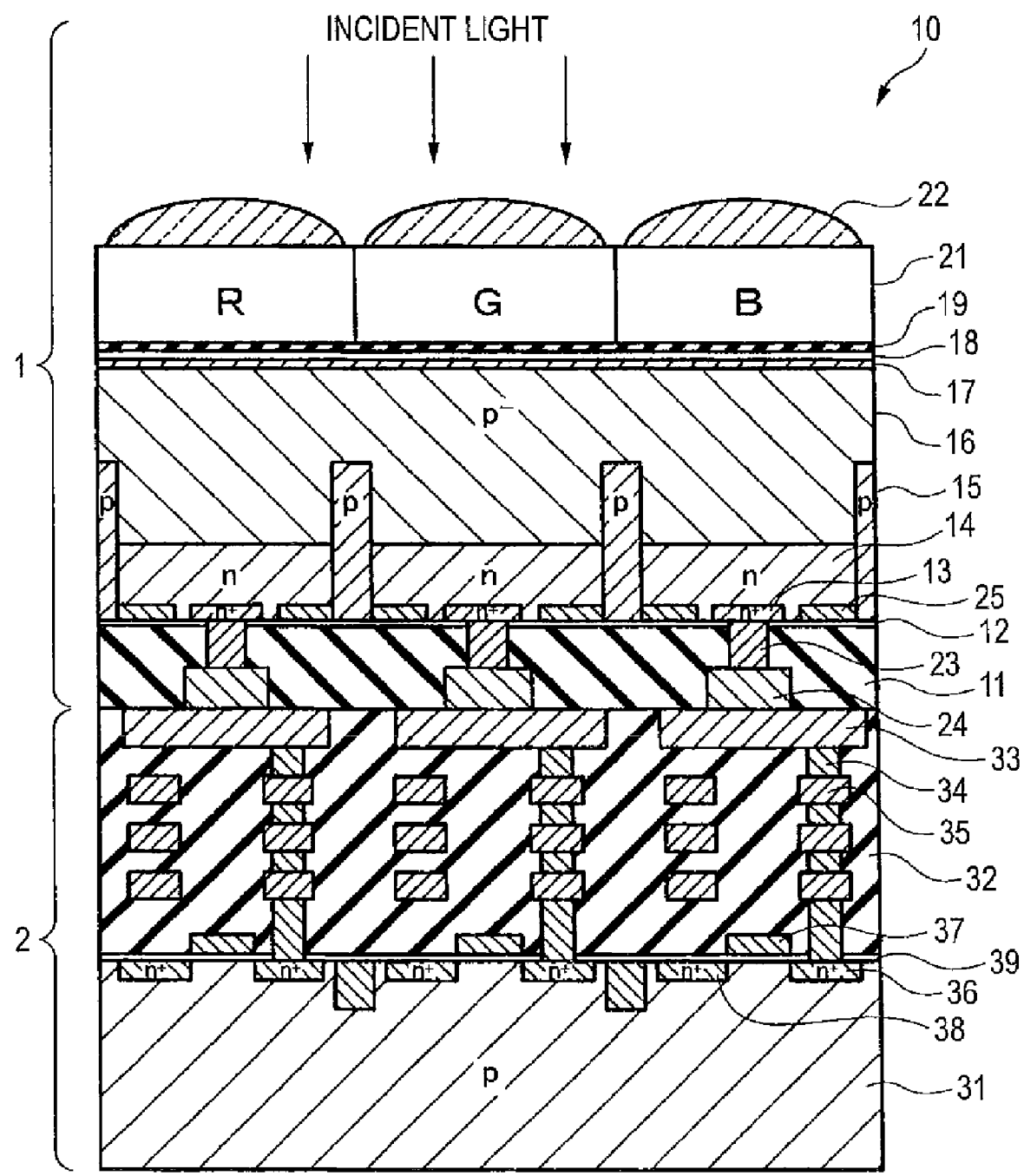
FIG. 1 is a sectional view showing the structure of an image pick-up element according to the present invention.

FIG. 1 is a sectional view showing the structure of an image pick-up element according to the present invention. The image pick-up element 10 according to the present invention includes an optical element substrate part 1 and a CMOS circuit substrate part 2 connected to a side of the optical element substrate part 1 opposite to a side on which a light is incident. The image pick-up element 10 generates a signal charge by photo-electrically converting an incident light applied from one surface side of the optical element substrate part 1 to read the signal charge from the other surface side of the optical element substrate part and pick up an image. In this embodiment, as shown in FIG. 1, the light is allowed to be incident from an upper side of the optical element substrate part 1 and the signal charge is read from a lower side of the optical element substrate part 1.

The optical element substrate part 1 is provided with a p type semiconductor substrate including a p− type silicon layer (p− layer) 16 and a p+ type silicon layer (p+ layer) 17 having an impurity concentration higher than that of the p− type silicon layer 16. The P type semiconductor substrate and an n layer 14 function as a photoelectric conversion layer for generating the signal charge in accordance with the incident light. In this embodiment, the thickness of a depletion layer of the photoelectric conversion layer is preferably 5 μm or more to 20 μm or less.

In the vicinity of the lower surface of the p type semiconductor substrate, a plurality of n type impurity diffusion layers (n layer) 14 are arranged in parallel with the surface. Further, in the lower part of the n layer 14, an n+ impurity diffusion layer (n+ layer) 13 having an impurity concentration higher than that of the n layer 14 is formed for each n layer 14. The n+ layer 13 functions as a charge storage part for storing the signal charge generated in the p type semiconductor substrate. In both sides of the n+ layer 13, p type impurity diffusion layers 25 of a high concentration are formed to prevent a neighboring interface of $Si/SiO_2$ from being depleted to generate a dark current. To reduce the dark current, a method is exemplified that the entire part of the surface of the semiconductor substrate excluding an element separation band of a pixel is formed with an n layer of a high concentration. In this case, a borderline (a circular arc) to the element separation band is long and an interface depleted layer is undesirably formed along the borderline. Accordingly, it is reasonable to form then type area of the high concentration as small as possible.

Between the adjacent n layers 14, an element separation area 15 composed of a p type impurity diffusion layer is formed.

In a surface on which the n+ layers 13 and the p layers 15 and 25 are formed, an insulating layer 11 is formed through a gate insulating film 12.

In the insulating layer 11, a post shaped plug electrode 23 is formed that is electrically connected to the lower surface of the n+ layer 13 and vertically extended and a micro bump 24 that functions as an element side connecting terminal is formed in the end part of a lower part of the plug electrode 23. The micro bump 24 is formed to be exposed to an external part in the lower surface of the insulating layer 11.

On the upper surface of the p+ layer 17, an insulating layer 18 transparent to the incident light is formed. Further, on the upper surface of the insulating layer 18, a high refractive index layer 19 is formed that is transparent to the incident light such as a film made of silicon nitride or carbon having a diamond structure in order to prevent the reflection of the light in the lower surface of the p type semiconductor substrate caused from the difference of a refractive index between the insulating layer 18 and the p type semiconductor substrate.

On the high refractive index layer 19, a color filter layer 21 is formed on which any one of R (red), G (green) and B (blue) is arranged in a prescribed pattern for each pixel. On the color filter 21, an upward convex lens shaped microlens layer 22 having an upward protruding curved surface is formed. The microlens layer 22 may not be provided and only the color filter layer 21 may be provided on the high refractive index layer 19.

The CMOS circuit substrate part 2 includes an insulating layer 32. On the upper surface of the insulating layer 32, a micro bump 33 is formed that functions as a circuit side connecting terminal connected to the micro bump 24 connected to the lower surface of the optical element substrate part 1 and exposed to the lower surface.

Further, in the insulating layer 32, are formed a plug electrode 34 electrically connected to the micro bump 33 and extended vertically and a wiring layer 35 made of aluminum or the like connected to the plug electrode 34. In the lower surface of the insulating layer 32, a semiconductor substrate 31 composed of a p type impurity diffusion layer is provided through a gate insulating film 39.

In the vicinity of the upper surface of the semiconductor substrate 31, are formed a charge storage area 36 composed of an n+ type impurity diffusion layer connected to the lower end part of the plug electrode 34 and a charge detecting area 38 composed of an n+ type impurity diffusion layer spaced horizontally from the charge storage area 36. Further, on the upper surface of the gate insulating film 39, a reading electrode 37 is formed for reading the signal charge stored in the charge storage area 36 to the charge detecting area 38.

In the image pick-up element 10 having the above-described structure, the light incident on the microlens layer 22 passes through the color filter layer 21 and is photoelectrically converted into the signal charge in the p type semiconductor substrate and the signal charge is stored in the n+ layer 13. Then, the signal charge is stored in the charge storage area 36 of the semiconductor substrate 31 of the CMOS circuit substrate part 2 through the plug electrode 23, the microbump 24 of the optical element substrate part 1, the micro bump 33 of the CMOS circuit substrate part 2 and the plug electrode 34. Then, when a voltage is applied to the reading electrode 37, the signal charge stored in the charge storage area 36 is read to the charge detecting area 38, and then, inputted to a signal processing circuit or the like.

Now, a procedure for manufacturing the image pick-up element of this embodiment will be described below.

Figure 2:
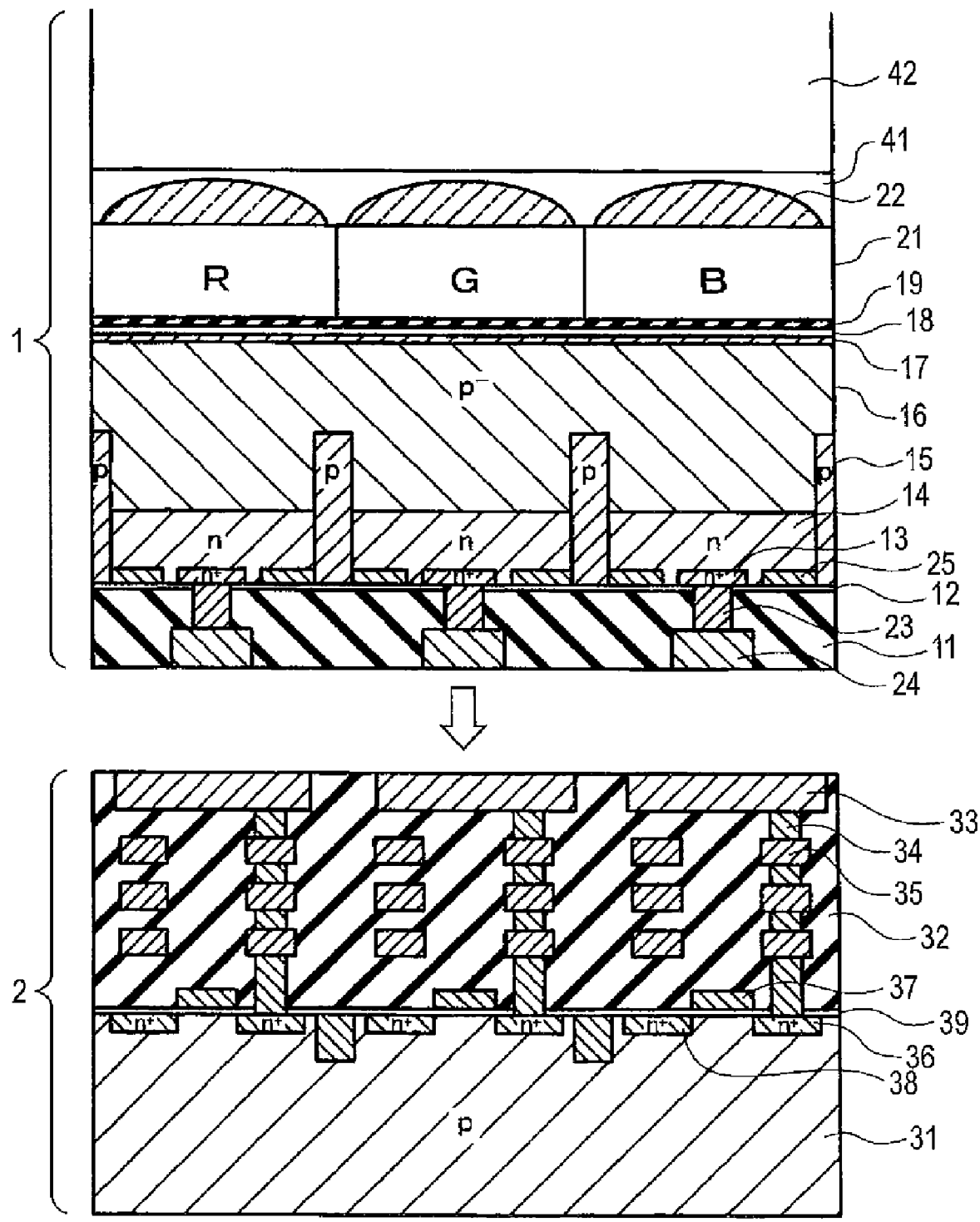
FIG. 2 is a diagram for explaining a state that an optical element substrate part is connected to a CMOS circuit side substrate part.

FIG. 2 is a diagram for explaining a state that the optical element substrate part is to be connected to the CMOS circuit substrate part. In the embodiment described below, members having equal structures and operations to those of the already described members are designated by the same or corresponding reference numerals in the drawing and an explanation thereof will be simplified or omitted.

As shown in FIG. 2, after the optical element substrate part 1 and the CMOS circuit substrate part 2 are separately manufactured, the upper surface of the CMOS circuit substrate part 2 is connected to the lower surface of the optical element substrate part 1 so that the micro bump 24 of the optical element substrate part 1 is connected to the micro bump 33 of the CMOS circuit substrate part 2.

Since the thickness of the optical element substrate part 1 is thin as small as several ten μm, the optical element substrate part 1 is liable to be cracked. Thus, the optical element substrate part 1 is considered to be hardly treated under a state before the optical element substrate part 1 is connected to the CMOS circuit substrate part 2. Thus, as shown in FIG. 2, when the optical element substrate part 1 is connected to the CMOS circuit substrate part 2, a transparent support substrate 42 for supporting the optical element substrate part 1 may be stuck to the upper surface of the microlens layer 22 through an adhesive layer 41. As the adhesive layer 41, a layer having a refractive index smaller than that of the microlens layer 22 is used. As the support substrate 42, for instance, a transparent glass substrate may be employed. In such a way, since the optical element substrate part 1 is supported by the support substrate 42, the optical element substrate part 1 is easily treated under the state before the optical element substrate part 1 is connected to the CMOS circuit substrate part 2.

Further, in the image pick-up element 10 according to the present invention, it is assumed that the optical element substrate part 1 and the CMOS circuit substrate part 2 are respectively manufactured by different producers. For instance, it is assumed that a producer of the optical element substrate part 1 buys the CMOS circuit substrate part 2 from a producer who manufactures the CMOS circuit substrate part 2 and sticks the CMOS circuit substrate part 2 to the optical element substrate part 1 to form the image pick-up element 10. On the contrary, it is assumed that the producer of the CMOS circuit substrate part 2 buys the optical element substrate part 1 from the producer of the optical element substrate part 1 and sticks the CMOS circuit substrate part 2 to the optical element substrate part 1 to form the image pick-up element 10. Further, it is assumed that both the optical element substrate part 1 and the CMOS circuit substrate part 2 are bought and stuck to each other to produce the image pick-up element 10. In these production processes, when the optical element substrate part 1 under a separated state before the optical element substrate part 1 is connected to the CMOS circuit substrate part 2 is handled, since the optical element substrate part 1 is supported by the support substrate, the optical element substrate part 1 can be assuredly handled without generating a defect in the optical element substrate part 1.

According to the image pick-up element 10 having the above-described structure, the optical element substrate part 1 having a function for photo-electrically converting the incident light is stuck to the CMOS circuit substrate part 2 to form the image pick-up element. Thus, the optical element substrate part 1 and the CMOS circuit substrate part 2 can be respectively previously manufactured under a separated state. Since the incident light applied form one surface side of the optical element substrate part 1 is photo-electrically converted to generate the signal charge and the signal charge is read from the other side of the optical element substrate part 1 located near the circuit substrate part, a circuit part does not need to be formed in the optical element substrate part 1 so that an opening of a light receiving part of the optical element substrate part 1 can be designed to be large. Therefore, the micronization and the high function of the pixel can be advantageously realized.

As compared with a process that a circuit part and an optical element part are sequentially manufactured on a semiconductor substrate as in the related-art CMOS type image pick-up element, the yield of the image pick-up element itself can be avoided from decreasing as a result of receiving the influence of the decrease of the yield of either the circuit part or the optical element part. Further, the already manufactured optical element substrate part 1 is connected to the CMOS circuit substrate part 2 so that the production efficiency of the image pick-up element 10 can be improved.

Further, since the optical element part does not need to be formed in the CMOS circuit substrate part 2, a time necessary for a production process can be shortened, a degree of freedom of design of a circuit in the CMOS circuit substrate part 2 is high and a design efficiency can be improved.

Figure 3:
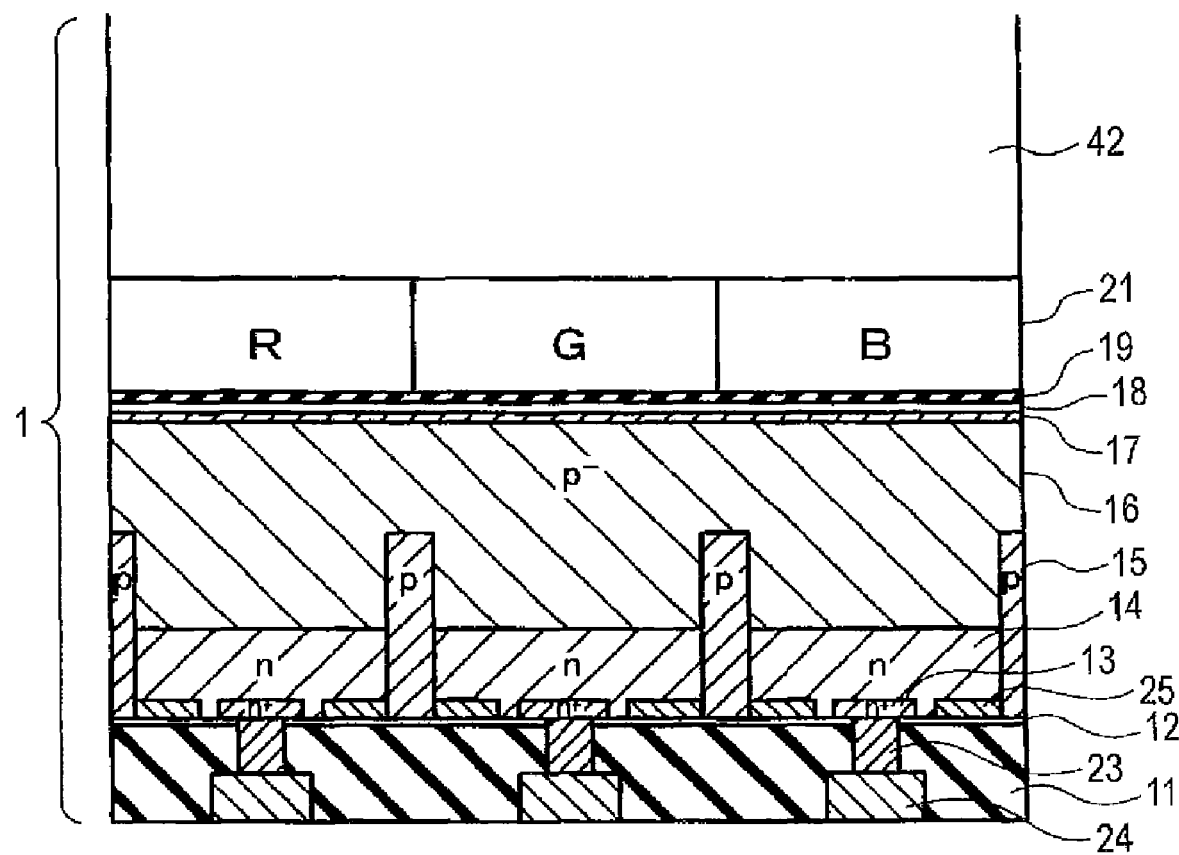
FIG. 3 is a sectional view showing other structural example of the optical element substrate part.
Figure 4:
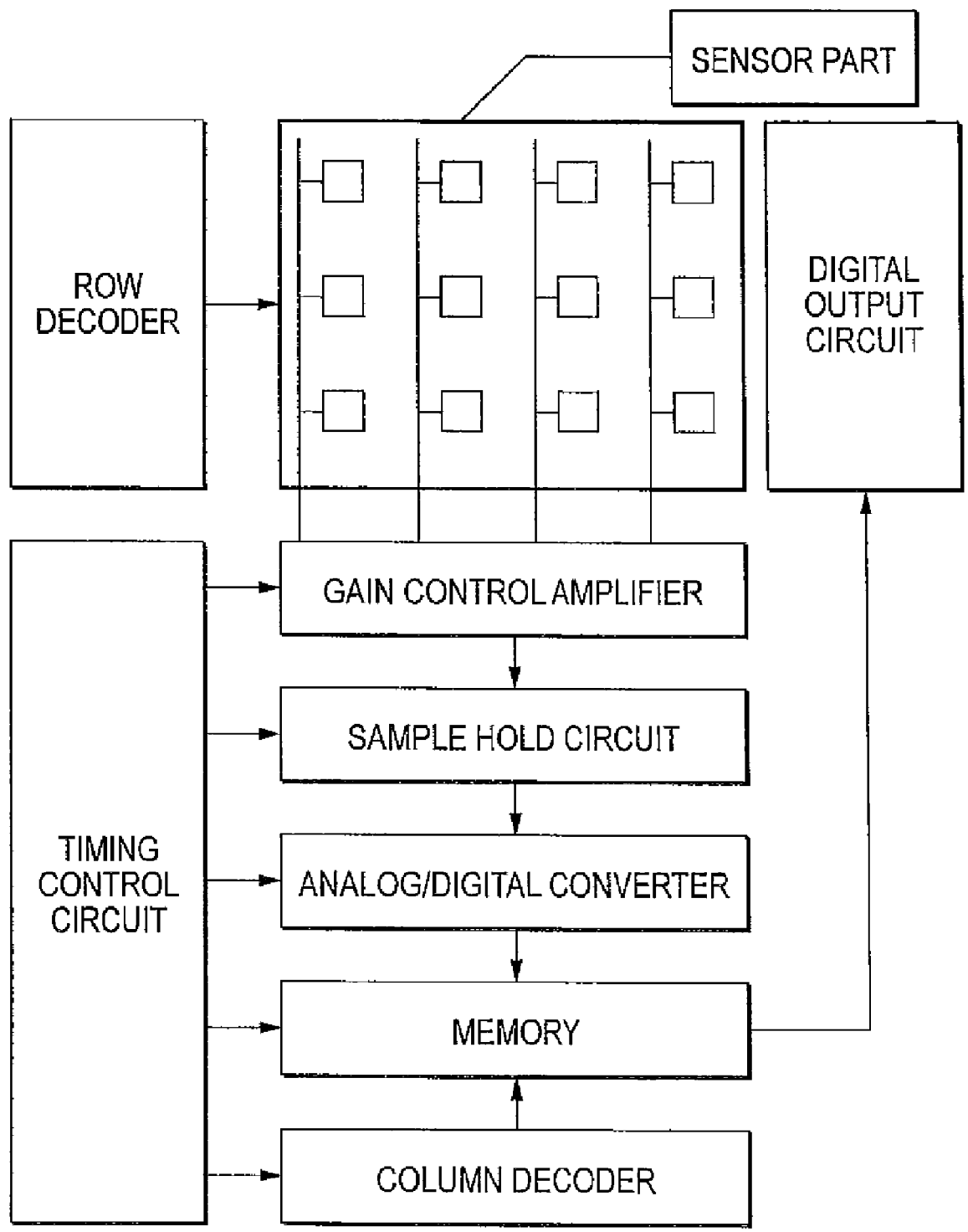
FIG. 4 is a diagram showing one example of a structure of the related-art CMOS type image sensor.

FIG. 3 is a sectional view showing other structural example of the optical element substrate part. As shown in FIG. 3, the optical element substrate part 1 may not include a microlens layer 22 (see FIG. 1) on a color filter layer 21. When the microlens layer 22 is not provided, the optical element substrate part 1 can have a transparent support substrate 42 for supporting the optical element substrate part 1 stuck onto the color filter layer 21 and an adhesive layer 41 (see FIG. 2) for sticking the support substrate 42 to the optical element substrate part 1 does not need to be provided.

Further, in the present invention, a photoelectric conversion element array can be provided that is used for an element which includes an optical element substrate part 1 of an image pick-up element and generates a signal charge by photo-electrically converting an incident light applied from one surface side of the optical element substrate part 1 to read the signal charge from the other surface side of the optical element substrate part 1 and pick up an image. Referring to FIG. 3, in the photoelectric conversion element array, to a surface side (a lower surface in FIG. 3) opposite to the surface side (an upper surface in FIG. 3) on which a light is incident, a micro bump 24 is exposed. Then, the photo-electric conversion element array is attached to the light incident surface of the CMOS type image pick-up element of the related-art structure so that the photo-electrically converted signal charge can be transferred to the CMOS type image pick-up element by the micro bump 24 functioning as a connecting terminal. Therefore, the related-art CMOS type image pick-up element can be used.

According to the present invention, the image pick-up element and the photoelectric conversion element array can be provided that improves the design and production efficiency of the circuit part, has the structure advantageous for the micro formation, the high function and the high sensitivity and can reduce the development cost.

The entire disclosure of each and every foreign patent application from which the benefit of foreign priority has been claimed in the present application is incorporated herein by reference, as if fully set forth.

What is claimed is:

1. An image pick-up element comprising:
   an optical element substrate part in which the image pick-up element generates a signal charge by photo-electrically converting an incident light applied from one surface side of the optical element substrate part to read the signal charge from the other surface side of the optical element substrate part and picks up an image, wherein the optical element substrate part comprises a photoelectric conversion layer to generate the signal charge by photo-electrically converting the incident light;
   a CMOS circuit substrate part connected to the other surface side of the optical element substrate part so as to transfer the signal charge generated in the photoelectric conversion layer;
   an element side connecting terminal connected to the photoelectric conversion layer for each pixel of the optical element substrate part; and
   a circuit side connecting terminal formed on a surface of a side in the CMOS circuit substrate part to be connected to the optical element substrate part, wherein
   the element side connecting terminal and the circuit side connecting terminal are connected to each other on the other surface side of the optical element substrate part,
   the element side connecting terminal is a micro bump, and
   the circuit side connecting terminal is a micro bump.

2. An image pick-up element according to claim 1, wherein the photoelectric conversion layer comprises a depletion layer having a thickness of 5 μm or more to 20 μm or less.

3. An image pick-up element according to claim 1, further comprising a color filer layer formed on the one surface of the optical element substrate part.

4. An image pick-up element according to claim 3, further comprising a microlens layer formed on the color filter layer.

5. An image pick-up element according to claim 1, further comprising a transparent support substrate that supports the optical element substrate part when the optical element substrate part is connected to the CMOS circuit substrate part, the transparent support substrate being in the one surface side of the optical element substrate part.

6. An image pick-up element according to claim 4, further comprising:
   a transparent support substrate that supports the optical element substrate part when the optical element substrate part is connected to the CMOS circuit substrate part, the transparent support substrate being in the one surface side of the optical element substrate part; and
   an adhesive layer whose refractive index is lower than that of the microlens layer to connect the support substrate to the optical element substrate part, the adhesive layer being between the microlens layer and the transparent support substrate.

7. A photoelectric conversion element array comprising an optical element substrate part in which the photoelectric conversion element array generates a signal charge by photo-electrically converting an incident light applied from one surface side of an optical element substrate part to read the signal charge from the other surface side of the optical element substrate part and picks up an image,
   wherein the optical element substrate part comprises:
   a photoelectric conversion layer to generate the signal charge by photo-electrically converting the incident light, the photoelectric conversion layer being provided over a plurality of pixel regions arranged in an array manner; and
   a connecting terminal formed as a micro bump for each of said plurality of pixel regions, each connecting terminal formed as a micro bump being provided in the other surface side of the optical element substrate to transfer the signal charge generated in the photoelectric conversion layer.

* * * * *